(12) United States Patent
Tesauro et al.

(10) Patent No.: US 6,355,979 B2
(45) Date of Patent: Mar. 12, 2002

(54) HARD MASK FOR COPPER PLASMA ETCH

(75) Inventors: Mark Richard Tesauro, Fountain Hills; Peter D. Nunan, Scottsdale, both of AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/318,474

(22) Filed: May 25, 1999

(51) Int. Cl.[7] .................................................. H01L 23/12
(52) U.S. Cl. ........................................................ 257/732
(58) Field of Search ................................ 438/637–712; 257/762–772

(56) References Cited

U.S. PATENT DOCUMENTS

| | | | | |
|---|---|---|---|---|
| 6,008,140 A | * | 12/1999 | Ye et al. | 438/742 |
| 6,057,230 A | * | 5/2000 | Liu | 438/637 |
| 6,080,529 A | * | 6/2000 | Ye et al. | 430/313 |

OTHER PUBLICATIONS

"Low Temperature Copper Etching Using an Inductively Coupled Plasma with Ultraviolet Light Irradiation," Kang –Sik Choi and Chul–Hi Han, The Electrochemical Society, Inc., 1998, pp. 1–5.

* cited by examiner

Primary Examiner—Fetsum Abraham
(74) Attorney, Agent, or Firm—Lisa K. Jorgenson; Daniel E. Venglarik

(57) ABSTRACT

A hard mask, e.g., a silicon dioxide or silicon nitride film, is used to avoid organic polymer materials in copper plasma etch applications. The hard mask would be deposited as a blanket layer on the Cu metal layer and itself be patterned and etched with a conventional photolithographic resist pattern. The hard mask etch is stopped shortly before the Cu surface is exposed. Halting the hard mask etch before the Cu surface is exposed facilitates the use of conventional cleaning processes following the hard mask etch. The remaining thin layer of hard mask can be etched through during the beginning of the Cu metal etch process. Any remaining hard mask deposited on the Cu metal layer can form a part of a new dielectric layer.

17 Claims, 4 Drawing Sheets

HARD MASK FOR COPPER PLASMA ETCH

BACKGROUND OF THE INVENTION

1. Field of the Invention

The present invention relates to integrated circuit structures and fabrication methods; and in particular to integrated circuit fabrication methods utilizing a copper plasma etch process.

2. Description of the Prior Art

Low temperature (<80 C.) plasma etch processes for copper (Cu) metal etch applications have been demonstrated and are in development for semiconductor manufacturing applications. The use of conventional photolithographic processing with organic photo resists for such etch processes produces the typical etch byproducts: organic polymers which incorporate the components of the films being etched. The removal of these polymers is especially problematic in the case of copper metal etch due to the reactivity of this material and the associated corrosion effects of aggressive cleaning technologies and solvents.

Plasma etch processes for copper metal layers have been demonstrated using a conventional photolithographic resist mask at temperatures as low as 60° C. (see, e.g., K. S. Choi, C. H. Han, J. Electrochem Soc., V. 145, No.3, March 1998, which is hereby incorporated by reference).

One problem encountered in using conventional plasma etch on resist pattern processing is the post etch clean. Conventional resists are polymerized during the etch process, producing by-products with incorporate components of the films being etched. These tainted polymers are often difficult to remove, requiring products which incorporate aggressive solvents and plasma etch processes which are incompatible with the copper.

SUMMARY OF THE INVENTION

For copper plasma etch applications, a hard mask, e.g., a silicon dioxide or silicon nitride film, is used to avoid organic polymer materials. The hard mask would be deposited as a blanket layer on the Cu metal layer and itself be patterned and etched with a conventional photolithographic resist pattern. The hard mask etch could either be stopped shortly before the Cu surface is exposed or, less preferably, when the Cu surface is exposed. Halting the hard mask etch before the Cu surface is exposed facilitates the use of conventional cleaning processes following the hard mask etch. The remaining thin layer of hard mask can be etched through during the beginning of the Cu metal etch process. Any remaining hard mask on the Cu metal layer can form a part of a new dielectric layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The following description details the operation and features of several preferred embodiments of the present invention, but it will be understood by those of skill in the art that the scope of the invention is defined only by the issued claims, and not by any description herein.

The use of a dielectric hard mask for copper metal etch, as well as other metal etch applications, including aluminum and tungsten, can eliminate organic polymer formation during the metal etch process. The preferred embodiment is particularly effective in this respect when only a partial etch of the hardmask material is completed before the metal etch process.

Figure 1:
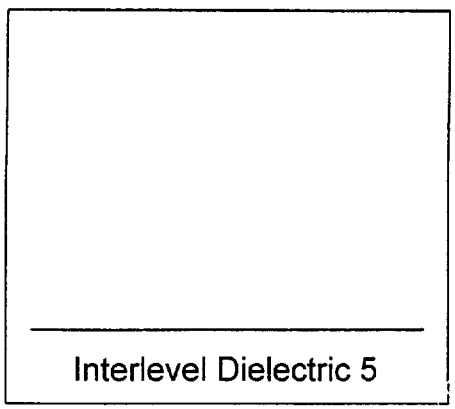
FIGS. 1–4 show a partially fabricated semiconductor structure after several sequential deposition steps in a formation process in accordance with a preferred embodiment of the invention.
Figure 2:
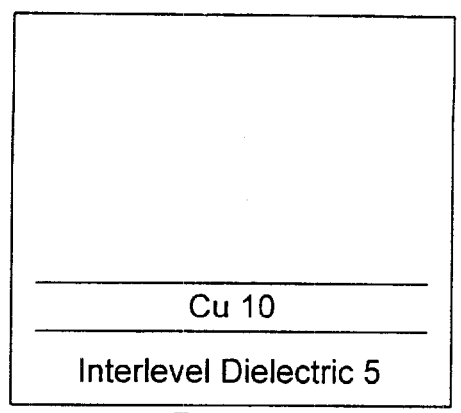

Referring first to FIGS. 1–2, a conventional interlevel dielectric 5 (ILD) is first provided, as in FIG. 1. Note that while the ILD is shown here as a first (bottom-most) layer, this structure may be deposited on top of other layers. The dielectric can be any conventional material, but it is preferred that the ILD be compatible with the hardmask described below.

Next, a copper metal layer 10 is deposited on the ILD 5, using conventional means, as shown in FIG. 2. Note that although the preferred embodiment uses copper for the metal layer, this may be replaced by other suitable metals, such as aluminum, tungsten, or titanium nitride. Of course, some choices of metal layers would not necessarily require the disclosed process, but the process can nevertheless be effectively used with these metals.

Figure 3:
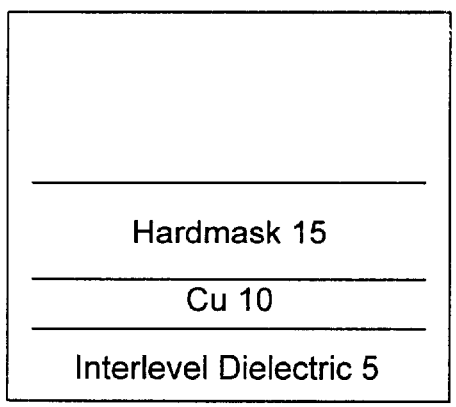
Figure 4:
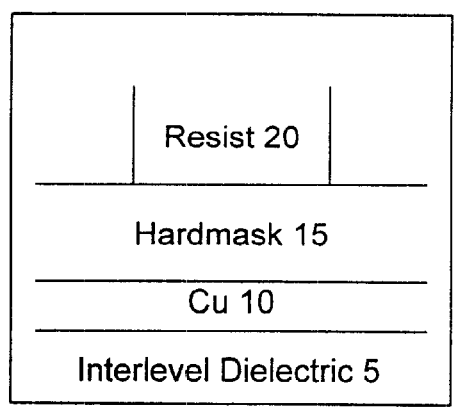

With reference now to FIGS. 3–4, the hard mask material 15, which is, e.g., silicon oxide or silicon nitride, is deposited over the metal layer 10, as shown in FIG. 3. The hard mask is then overlaid with an organic resist pattern, as shown in FIG. 4.

Figure 5A:
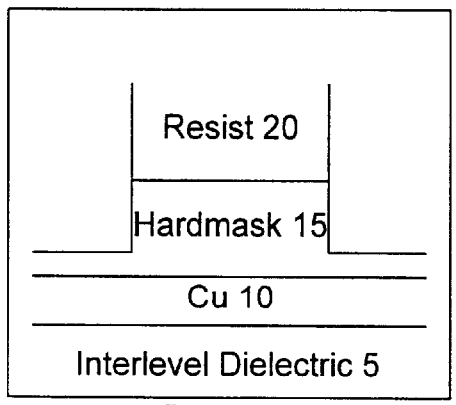
FIGS. 5A–5B depict a partially fabricated semiconductor structure after preferred and alternate hard mask etch steps in a process in accordance with a preferred embodiment of the invention.
Figure 5B:
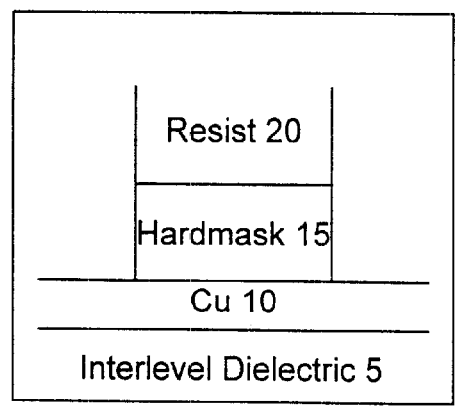
Figure 6:
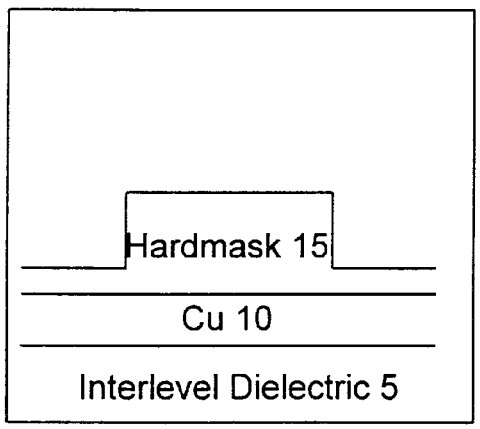
FIG. 6 shows a partially fabricated semiconductor structure after a resist removal step in a process in accordance with a preferred embodiment of the invention.

Referring now to FIG. 5A and alternate embodiment FIG. 5B, the hardmask 15 is then etched using typical plasma dielectric etch processes to a point, in the preferred embodiment, just prior to exposing the surface of metal layer 10, as shown in FIG. 5A. With no metal exposed on the wafer surface, highly aggressive conventional post-etch cleaning procedures can be used to remove the remaining resist and polymers (and any other organic residues) prior to metal etch, as shown in FIG. 6. In a less preferred embodiment, the etch is continued until the underlying metal layer is exposed, as shown in FIG. 5B.

Figure 7:
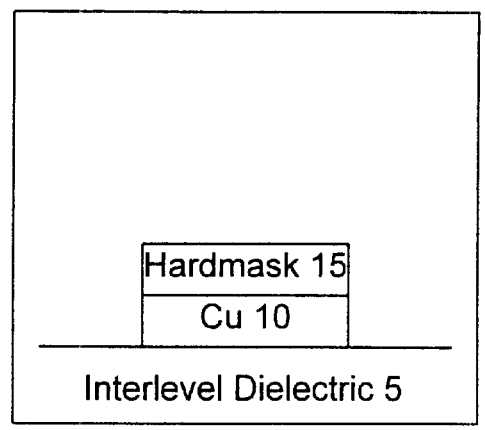
FIG. 7 depicts a partially fabricated semiconductor structure after a metal etch step in a process in accordance with a preferred embodiment of the invention.

With reference now to FIG. 7, the subsequent metal etch process, in the preferred embodiment, consists of an initial hard mask etch step which ideally has a selectivity between the metal and oxide film of unity, i.e., both films are etched at the same rate. In this manner the complete removal of the residual hard mask material can be assured before progressing to a second process step with a higher selectivity to the hard mask material and, ideally, a higher etch rate of the metal material, which may be, e.g., Cu, Al, W, etc., as shown in FIG. 7.

Figure 8:
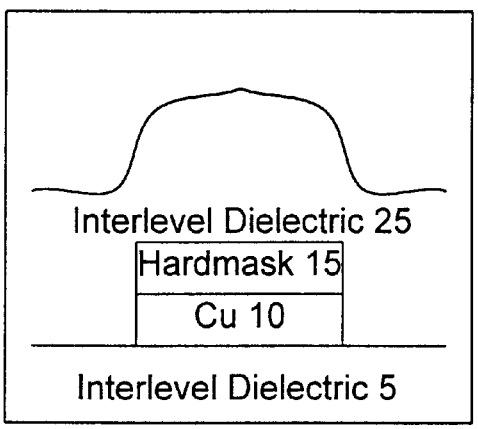
FIG. 8 shows a partially fabricated semiconductor structure after an interlevel dielectric deposition step in a process in accordance with a preferred embodiment of the invention.

Referring now to FIG. 8, another advantage of this approach is that following the metal etch process the residual hard mask material, being a dielectric film, can be left behind and incorporated into the intermetal dielectric layer of the following metal level, as shown. For this reason, many different materials can be used for the hardmask, including Si3N4, SiO2, and others, but it is preferred that the hardmask material be one that can be readily incorporated into the ILD stack.

Figure 9:
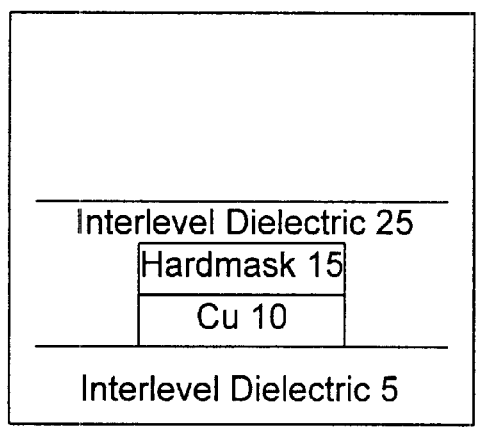
FIG. 9 shows a partially fabricated semiconductor structure after a CMP polishing step in a process in accordance with a preferred embodiment of the invention.

With reference now to FIG. 9, the upper ILD, which now incorporates the remaining hard mask, can be planarized using conventional chemical/mechanical polishing (CMP) techniques.

Figure 10A:
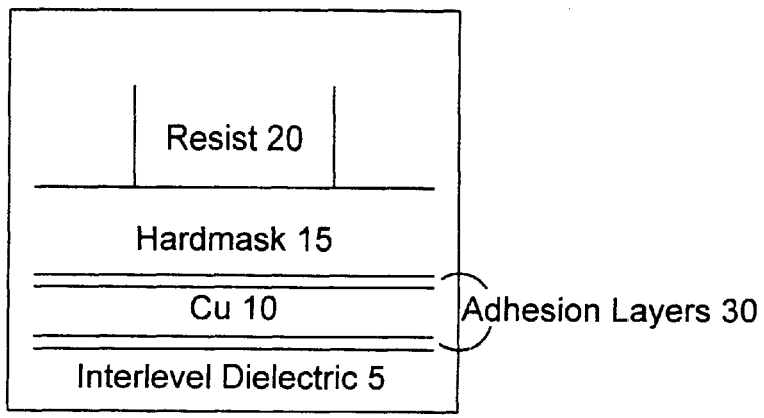
FIGS. 10A–10C show a partially fabricated semiconductor structures after various steps in a process in accordance with an alternate embodiment of the invention.
Figure 10B:
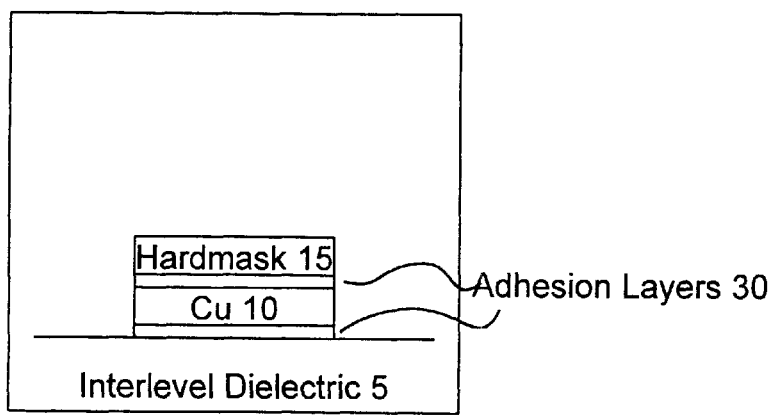
Figure 10C:
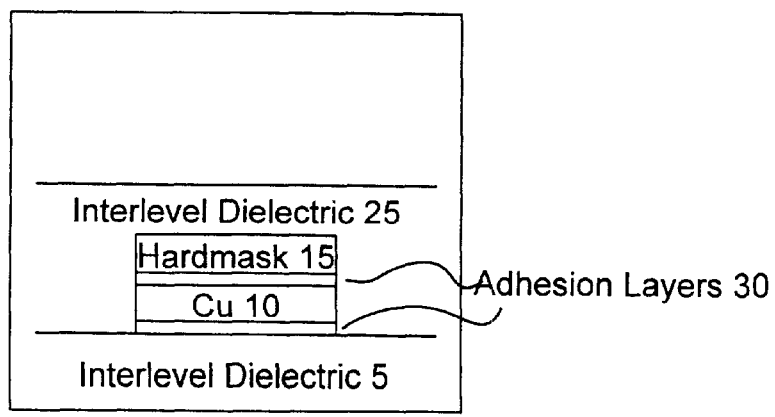

Referring now to FIGS. 10A–10C, in many cases an adhesion layer of a different metal will be needed in-between the metal layer and the hardmask layer or between the metal layer and the underlying film layer. This adhesion layer can also serve as an etch-stop during the hard mask etch. This is especially beneficial if the adhesion material, e.g. TiN or TaN, is resistant to the chemical cleans necessary to remove organic polymers following the hard mask etch process. Alternative embodiments which include these adhesion layers are shown in FIGS. 10A–10C. FIG. 10A corresponds to FIG. 4, FIG. 10B corresponds to FIG. 7, and FIG. 10C corresponds to FIG. 9. Of course, many materials can be used for the adhesion material, including TiN, TaN, TiAlN, TiSiN, WNx, WSiN, TiWN, TaNx, TaSiN, CrN, and CrAlN.

Figure 11:
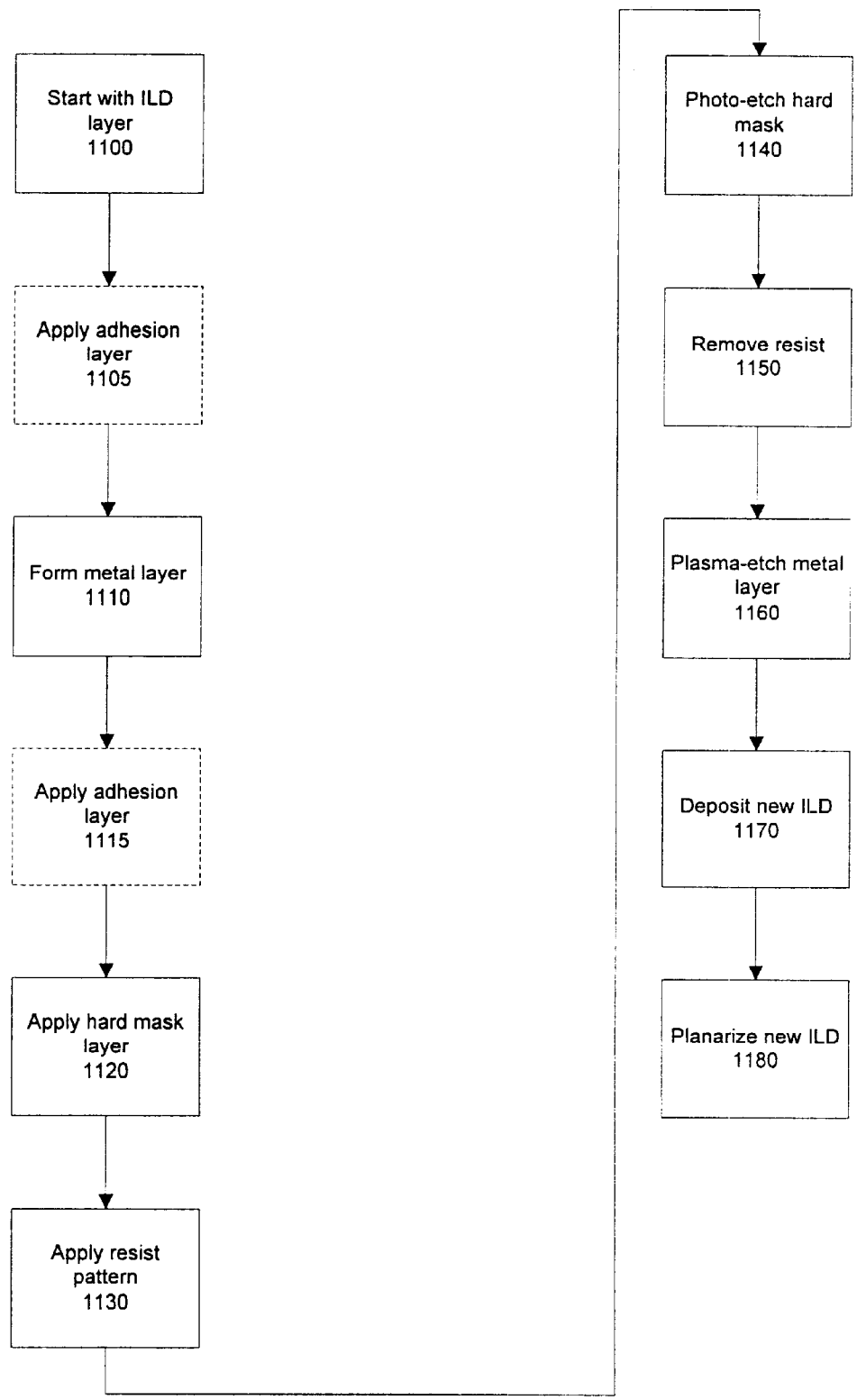
FIG. 11 depicts a flowchart of a semiconductor formation process in accordance with a preferred embodiment of the invention.

With reference now to FIG. 11, a flowchart of a semiconductor fabrication process according to the preferred embodiment is shown. First, an interlevel dielectric layer is provided (step 1100). Next, an optional adhesion layer is deposited on the ILD (step 1105), and the copper metal layer is deposited (step 1110). Another optional adhesion layer is placed on the copper (step 1115), and the metal (and optional adhesion layer, if present) is covered by the hard mask material (step 1120). The hard mask is then patterned with resist (step 1130).

Next, the hard mask is etched using a conventional photolithographic method (step 1140), to a point just short of exposing the metal layer. The amount of hard mask material left over the metal layer will depend on the uniformity of the films and the plasma etch removal process, as well as the dielectric consumption (if any) of the following cleaning steps to remove the organic polymer materials. It should be thin enough so that it can be effectively removed during the following metal etch step (step 1160, below). Therefore, the precise thickness of the remaining hardmask is process-dependent, but can be easily determined by one of skill in the art without any undue experimentation. The photoresist and polymer are then removed with conventional cleaning processes (step 1150).

Next, the metal layer is etched using the hard mask pattern, removing any remaining hard mask material covering the metal layer at areas which were not protected by the photoresist (step 1160), completing the metal etch process.

A new ILD layer can then be deposited over the structure, and any remaining hard mask over the metal line will become part of the new ILD (step 1170). Finally, the new ILD can be planarized to prepare it for another metal layer (or other structure) (step 1180).

While the invention has been particularly shown and described with reference to a preferred embodiment, it will be understood by those skilled in the art that various changes in form and detail may be made therein without departing from the spirit and scope of the invention.

It should also be noted that the number of layers of metallization described above does not implicitly limit any of the claims, which can be applied to processes and structures with more or fewer layers.

Similarly, while the contact from first metal to poly and active has been particularly described, it will be readily recognized that the disclosed inventions are equally applicable to processes with multiple layers of metal (and in fact would be most commonly used in such processes).

What is claimed is:

1. An integrated circuit structure, comprising:
   a first dielectric layer;
   a copper metal layer deposited above the dielectric layer; and
   a partially etched patterned hardmask layer of an oxide or nitride dielectric material deposited over the metal layer,
   wherein the patterned hardmask layer is used as an etch mask for patterning the copper metal layer, and
   wherein the patterned hardmask layer does not expose the metal layer.

2. The structure of claim 1, further comprising a patterned resist layer, the resist layer being deposited above the hardmask layer, wherein the patterned resist layer is used to mask an etch of the hardmask layer.

3. The structure of claim 1, further comprising an adhesion layer between the first dielectric layer and the metal layer.

4. The structure of claim 1, further comprising an adhesion layer between the metal layer and the hardmask layer.

5. The structure of claim 1, wherein the masking layer is patterned using a photolithographic process.

6. An integrated circuit structure, comprising:
   an interlevel dielectric layer;
   a copper layer formed over the dielectric layer; and
   a patterned, partially etched oxide or nitride masking layer over the copper layer, wherein the oxide or nitride masking layer is partially but not completely etched to form recessed regions over portions of the copper layer to be removed in forming interconnects from the copper layer, wherein a thickness of the masking layer in the recessed regions is less than a thickness of the masking layer over remaining portions of the copper layer.

7. The integrated circuit structure of claim 6, further comprising:
   an adhesion layer between the copper layer and the oxide or nitride masking layer.

8. The integrated circuit structure of claim 6, further comprising:
   photoresist over portions of the oxide or nitride masking layer which have not been partially etched.

9. The integrated circuit structure of claim 6, further comprising:
   an adhesion layer between the interlevel dielectric layer and the copper layer.

10. An integrated circuit structure, comprising:

an interlevel dielectric layer;

a copper layer over the dielectric layer; and an oxide hardmask either on the copper layer or on a patterned inorganic adhesive region on the copper layer, wherein the oxide hardmask is partially etched, having a first thickness over a portion of the copper layer to be formed into an interconnect and a second thickness less than the first thickness over remaining portions of the copper layer.

11. The integrated circuit structure of claim 10, wherein no portion of the copper layer is exposed through the oxide hardmask.

12. The integrated circuit structure of claim 11, further comprising:

patterned photoresist over the oxide hardmask region having the first thickness but not over the partially etched portions of the oxide hardmask having the second thickness.

13. The integrated circuit structure of claim 11, further comprising:

photoresist over the oxide hardmask, wherein the copper layer is protected from solutions employed to remove the photoresist by the oxide hardmask.

14. The integrated circuit structure of claim 10, wherein a width of the oxide hardmask regions having the first thickness equals a width of the interconnect.

15. The integrated circuit structure of claim 10, further comprising:

an inorganic adhesion layer between the copper layer and the oxide hardmask.

16. The integrated circuit structure of claim 10, wherein the oxide hardmask material is on the copper layer.

17. The integrated circuit structure of claim 10, wherein the first and second thicknesses are sufficiently different to allow removal of the partially etched portions of the oxide hardmask having the second thickness by an etch patterning the copper layer to form the interconnect within completely removing the oxide hardmask region having the first thickness.

* * * * *